(12) United States Patent
Mayo et al.

(10) Patent No.: US 8,890,211 B1
(45) Date of Patent: Nov. 18, 2014

(54) AC-DRIVEN HIGH ELECTRON MOBILITY TRANSISTOR DEVICES

(71) Applicant: Lockheed Martin Corporation, Bethesda, MD (US)

(72) Inventors: Michael J. Mayo, Palo Alto, CA (US); Alfred A. Zinn, Palo Alto, CA (US); Roux M. Heyns, San Francisco, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 31 days.

(21) Appl. No.: 13/725,409

(22) Filed: Dec. 21, 2012

Related U.S. Application Data

(60) Provisional application No. 61/579,572, filed on Dec. 22, 2011.

(51) Int. Cl.
*H01L 29/739* (2006.01)
*H01L 29/778* (2006.01)
*H01L 29/66* (2006.01)

(52) U.S. Cl.
CPC ........ *H01L 29/778* (2013.01); *H01L 29/66431* (2013.01)
USPC .................... 257/194; 257/192; 257/E21.403; 257/E29.246

(58) Field of Classification Search
CPC ............ H01L 29/2003; H01L 21/0254; H01L 29/66462; H01L 29/7787; H01L 21/02458
USPC ................... 257/194, 192, E21.403, E29.246
See application file for complete search history.

(56) References Cited

U.S. PATENT DOCUMENTS

2011/0068371 A1\* 3/2011 Oka ............................... 257/194
2011/0136305 A1\* 6/2011 Saxler et al. .................. 438/172

OTHER PUBLICATIONS

Gutsche, Christophe et al., "Controllable p-type doping of GaAs nanowires during vapor-liquid-solid growth," Journal of Applied Physics 105, 024305, 2009, 5 pages, University of Duisburg-Essen, Duisburg, Germany.

Ha, Young-Ki et al., "Defect Luminescence in Heavily Si-Doped n- and p-type GaAs," Journal of Korean Physical Society, Jan. 2000, pp. 42-48, vol. 36, No. 1, Springer Science & Business Media, South Korea.

Kressel, Henry et al., Chapter 10: Binary III-V Compounds, Semiconductor Lasers and Heterojunction LEDs, 1977, pp. 327-354, Academic Press, New York.

Kren, D.E. et al., "Low ohmic contacts to C-doped p-GaAs with Au/Zn/Au structure," Electronics Letters, Jun. 18, 1992, pp. 1248-1250, vol. 28 , No. 13, Institution of Engineering and Technology.

Krahenbuhl, L. et al., "Numerical treatment of rounded and sharp corners in the modeling of 2D electrostatic fields," Journal of Microwaves, Optoelectronics and Electromagnetic Applications, 2010, vol. X, No. Y.

\* cited by examiner

*Primary Examiner* — Andy Huynh
(74) *Attorney, Agent, or Firm* — McDermott Will & Emery LLP

(57) ABSTRACT

A high performance high-electron mobility transistor (HEMT) design and methods of manufacturing the same are provided. This design introduces a bias layer in to the HEMT allowing the transistor to be fed with alternating current (AC) alone without the need for a negative direct current (DC) bias power supply.

24 Claims, 9 Drawing Sheets

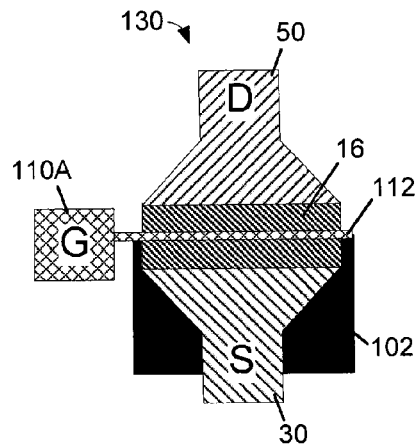
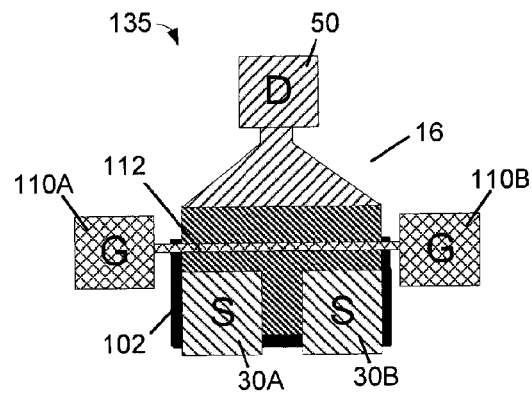
FIG. 6          FIG. 7
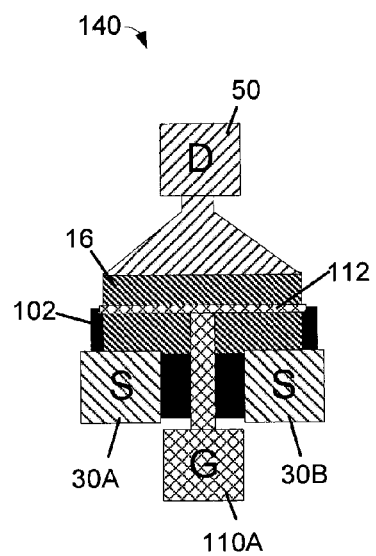
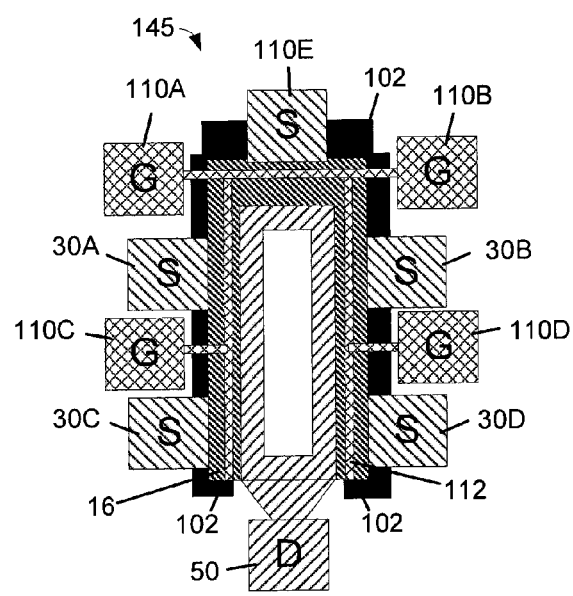
FIG. 8          FIG. 9

AC-DRIVEN HIGH ELECTRON MOBILITY TRANSISTOR DEVICES

CROSS-REFERENCE TO RELATED APPLICATIONS

This application claims priority to U.S. Provisional Application No. 61/579,572, filed Dec. 22, 2011, which is incorporated herein by reference in its entirety.

STATEMENT REGARDING FEDERALLY SPONSORED RESEARCH OR DEVELOPMENT

Not applicable.

BACKGROUND

1. Field of the Invention

The present invention generally relates to electronic devices, and, more specifically, to field effect transistors.

2. Description of the Related Art

Advanced radar and communication systems, as well as other electronics applications, depend on high-performance semiconductor amplifier devices. Limited performance of amplifier devices results in constrained performance of radar and communication systems in terms of high initial cost, undesirable failure rate, difficulty using higher frequency bands, and undesirably large volume, mass, power consumption and heat dissipation.

One type of field effect transistor that is used for high-frequency applications is a high electron mobility transistor (HEMT) that is able to operate at higher frequencies than an ordinary doped transistor. An HEMT uses a junction between two materials with different band gaps as the channel instead of a doped region as typically used in a conventional metal-oxide-semiconductor field-effect transistor (MOSFET). The bandgap difference results in the formation of conduction and valence band discontinuities at the layer interface creating a quantum well in the conduction band. The wider band gap semiconductor is doped with donors while the smaller band gap material is left undoped. The conduction band electrons move from the donor layer to the undoped layer, also called the transport layer, forming a two-dimensional electron gas (2DEG) in the transport layer along the interface. Since there are no impurities in the transport layer, there are no scattering centers. The presence of additional electrons in the transport layer provides higher conductivity without the scattering that slows down the electrons, thus providing much higher mobility that enables higher-frequency operation. A cross-section of a conventional HEMT is shown in FIG. 1.

In many applications, a conventional HEMT is biased into its linear region by combining a negative direct current (DC) bias voltage with the alternating current (AC) signal to drive the gate of the HEMT. In many situations, for example on a satellite, a dedicated negative power supply must be provided for this purpose, adding to the weight, cost, and complexity of the system.

Researchers have attempted to increase the gain of HEMTs by adding a second gate electrode beneath the channel. It has been demonstrated that this approach provides increased gain through the tremendous increase in transconductance. However, construction of such an HEMT is extraordinarily complex and is not amenable to manufacturing in useful numbers.

SUMMARY

A high-performance HEMT design and methods for manufacturing the same are provided herein. This design provides a bias layer within the buffer layer beneath a portion of the channel, which allows the transistor to be fed with AC alone without the need for a DC bias. Eliminating a DC power supply and several other components from conventional HEMTs gives improved heat dissipation and a reduction of mass, volume, manufacturing cost, power consumption, and potential failure modes. The present HEMTs can be manufactured by making certain modifications to conventional electronic device fabrication procedures.

In certain embodiments, a HEMT is disclosed that includes a transport layer comprising a first material having a first bandgap and a barrier layer comprising a second material disposed directly on the transport layer. The second material has a second bandgap that is different from the first bandgap and the bandgap difference between the first and second bandgaps results in a quantum well in a conduction band along an interface between the first and second materials. The HEMT also includes a bias layer disposed under a portion of the transport layer.

In certain embodiments, a HEMT is disclosed that includes a substrate, a buffer layer formed on the substrate, a transport layer formed directly on the buffer layer, a barrier layer formed directly on the transport layer, and a bias layer formed within the buffer layer under a portion of the transport layer.

In certain embodiments, a method of forming an HEMT is disclosed. The method includes the steps of depositing a base layer of a buffer layer on a substrate, applying P-type δ-doping to a portion of the base layer of the buffer layer to form a bias layer, depositing a top layer of the buffer layer on the base layer of the buffer layer, depositing a transport layer directly on the buffer layer, depositing a barrier layer directly on the transport layer, and forming a source, a gate, and a drain over the barrier layer.

In certain embodiments, a transistor is disclosed that includes a transport layer comprising a first material having a first bandgap and a barrier layer comprising a second material disposed directly on the transport layer. The second material has a second bandgap that is different from the first bandgap. The bandgap difference between the first and second bandgaps results in a quantum well in a conduction band along an interface between the first and second materials. The transistor also includes a gate disposed over the barrier layer and comprising a bevel on a bottom and downstream edge.

In certain embodiments, a transistor is disclosed that includes a transport layer comprising a first material having a first bandgap and a barrier layer comprising a second material disposed directly on the transport layer. The second material has a second bandgap that is different from the first bandgap. The bandgap difference between the first and second bandgaps results in a quantum well in a conduction band along an interface between the first and second materials. The transistor also includes a gate disposed over the barrier layer and comprising a body portion having a first width and a neck portion having a second width that is less than the first width. The neck portion is disposed between the body portion and the barrier layer.

The foregoing has outlined rather broadly the features of the present disclosure in order that the detailed description that follows can be better understood. Additional features and advantages of the disclosure will be described hereinafter, which form the subject of the claims. These and other advantages and features will become more apparent from the following description taken in conjunction with the drawings.

BRIEF DESCRIPTION OF THE DRAWINGS

For a more complete understanding of the present disclosure, and the advantages thereof, reference is now made to the following descriptions to be taken in conjunction with the accompanying drawings describing a specific embodiments of the disclosure, wherein:

FIGS. 6-9 are top views of various embodiments of HEMTs with a bias layer according to certain aspects of the present disclosure.

FIGS. 13B-13H illustrate the various stages of forming the gate as described in the flowchart of FIG. 13A according to certain aspects of the present disclosure.

DETAILED DESCRIPTION

The present disclosure is directed, in part, to high-electron-mobility transistors (HEMTs). HEMTs include a bias layer, thereby allowing the transistor to be operated solely with AC without a need for a DC bias voltage. This design feature not only increases the gain of an HEMT, compared to a standard transistor, but also simplifies the design and manufacturing processes. The present disclosure is also directed, in part, to methods for manufacturing an HEMT.

HEMTs are a class of semiconductor devices suitable for amplifying electrical signals at frequencies in the tens to hundreds of gigahertz. HEMTs are useful in communication applications that require linearity as well as high-power capability. Certain embodiments of HEMTs beneficially increase the gain in such devices. Certain embodiments of HEMTs allow an internal bias to be built into the devices so that the need for an external bias is eliminated.

Figure 1:
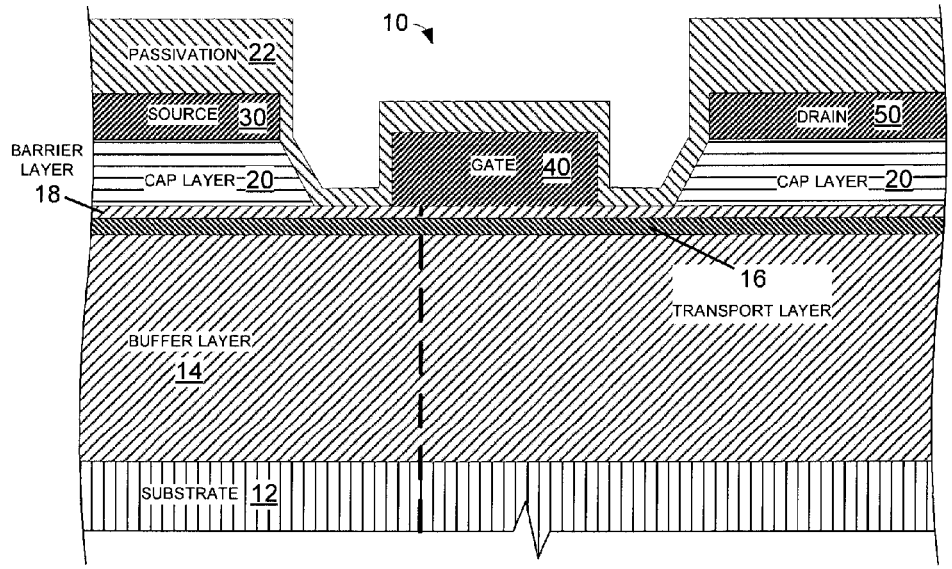
FIG. 1 is a cross-section of a conventional HEMT.

FIG. 1 is a cross-section of a conventional HEMT 10. HEMTs are typically configured as depletion-mode devices with a negative threshold voltage. As such, an HEMT is "normally on," e.g. current will flow from the source 30 to the drain 50 unless a negative voltage is applied to the gate 40. A positive voltage is applied to the drain 50 from a power supply and through a load. Hence, a conventional HEMT requires bias voltages of opposite polarities provided by two power sources. Providing the additional bias voltage requires, in a system, power and components with consequent cost, mass, and loss of reliability.

Conventional HEMTs can also be configured with a positive threshold voltage and such devices can be shut off with a zero bias, eliminating the need for the negative power source. Doing so, however, compromises performance.

In the example HEMT 10 of FIG. 1, a buffer layer 14, for example a layer of indium aluminum arsenide (InAlAs), epitaxially grown on a Gallium Arsenide (GaAs) substrate 12. The surface of the InAlAs may be lightly N-type δ-doped and then another layer of InAlAs formed over the doped surface. The transport layer 16 is then formed, for example a layer of undoped indium gallium arsenide (InGaAs). A barrier layer 18 is then formed on the transport layer 16, for example a thin layer of undoped InAlAs, the surface of which may be N-type δ-doped, with another layer of undoped InAlAs formed over the doped surface. The N-type dopant for InAlAs may be selected from the group of Si, Si, as $SiH_4$, S as $H_2S$, Se as $H_2Se$, Te, Sn, C, and Ge. Those of skill in the art will recognize that other N-type dopants may be used for InAlAs or for other materials used in either the buffer layer 14 or barrier layer 18.

Cap layers 20, for example a layer of InGaAs, are formed at the locations of the source 30 and drain 50. The source 30 and drain 50 are then formed of a layer of a conductive material, for example gold, on the cap layers 20 in the respective locations. In this example conventional HEMT 10, a layer of a conductive material is deposited on the barrier layer 18 between the source 30 and drain 50 to form the gate 40. The surface of the HEMT 10 is then covered with a layer of passivation 22. The thicknesses of the various layers and elements shown in FIG. 1 are illustrative only and are not necessarily to scale.

Figure 2:
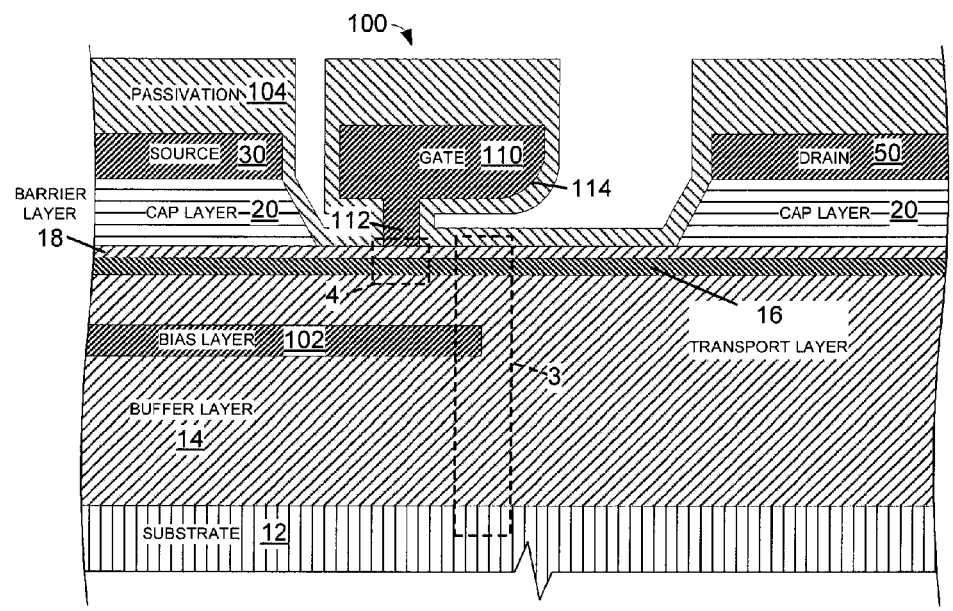
FIG. 2 is a cross-section of an example embodiment of a high-performance HEMT according to certain aspects of the present disclosure.

FIG. 2 is a cross-section of an example embodiment of a high-performance HEMT 100 according to certain aspects of the present disclosure. Elements of the HEMT 100 having the same number as the conventional HEMT 10 of FIG. 1 are essentially the same as discussed with respect to FIG. 1 and the description thereof is not repeated here. Although the disclosed invention is described in the context of an InGaAs material system, HEMTs having similar characteristics and advantages can be fabricated in other material systems, e.g., gallium nitride, and should not be limited to the examples described and shown herein. Certain embodiments of GaN semiconductor system may be preferred for high temperature applications. For example, Si at a doping level of $10^{16}$ becomes intrinsic above 330° C. with the Fermi level approaching the intrinsic level; in other words, the bandgap shrinks and the semiconductor material starts showing metallic conductivity and essentially fails. The large bandgap of GaAs may maintain the desired mode of semiconductor behavior at elevated temperatures compared to certain conventional HEMTs. GaN and SiC with bandgaps of 3.4 electron volts (eV) and 2.86-3.2 eV, respectively, may enable even higher operating temperatures.

In certain embodiments, the HEMT 100 may be driven solely with an AC voltage without the need for a DC bias. Eliminating a DC power supply and associated passive components provide an advantageous reduction of mass, volume, manufacturing cost, power consumption, heat dissipation and potential failure modes. When used in radar or communication systems, they can cost significantly less to build and operate.

The gate 110 of the HEMT 100 is shaped to provide a narrow neck portion 112 that is in contact with the barrier layer 18 and a larger body portion above, with the passivation layer 104 following the contours of the neck portion 112 and the underside of the body portion of the gate 110. This reduced-width of the contact region between the neck portion 112 and the barrier layer 18 shapes the electric field that extends into the transport layer 16 as is discussed in greater detail with respect to FIGS. 4 and 5. In certain embodiments, the neck portion 112 has a width that is less than 50% of the width of the body portion of gate 110. In certain embodiments, the neck portion 112 has a width that is less than 25% of the width of the body portion. In certain embodiments, the center of the neck portion 112 is offset from the center of the body portion of the gate 110 in a direction toward the source 30.

In certain embodiments, the bottom and downstream edge 114 of the body portion of the gate 110 is beveled, e.g. some of the material has been removed along the edge. In FIG. 2, this edge 114 is seen as a corner of the two-dimensional profile of the gate 110. In certain embodiments, the edge may have a flat, angled surface. In certain embodiments, the corner may be rounded, for example as shown in FIG. 2. In certain embodiments, the corner may be stepped. Removal of material from the edge 114 may reduce current or charge leakage from edge 114 to the drain 50 and may assist in completely shutting off flow of the 2DEG through the transport layer from the source 30 to the drain 50. The effect of this beveling is discussed in greater detail with respect to FIG. 5.

The HEMT 100 includes a bias layer 102 positioned within the buffer layer 14 under the transport layer 16. The presence of a bias layer 102 tends to keep the 2DEG better confined to the interface between the transport layer 16 and the barrier layer 18, as the 2DEG otherwise tends to leak deep into the undoped region of the transport layer 16. In certain embodiments, the bias layer 102 may be a sub-layer of the buffer layer that has been P-type δ-doped. Methods of fabricating the bias layer 102 and thicknesses of the various layers are discussed with respect to FIG. 3.

In certain embodiments, the bias layer 102 has a tip, e.g. the right edge in the orientation of FIG. 2, that is positioned between the right edge of the neck 112 and the right side of the gate 110. The effect of this positioning is discussed in greater detail with respect to FIG. 5. The region indicated by the dashed-line box 3 is enlarged in FIG. 3. The region indicated by the dashed-line box 4 is the area of the voltage map of FIG. 4.

In certain embodiments, the gate 110 and the bias layer 102 are provided with synchronous AC voltages having the same polarity, e.g. a zero phase shift, such that there is a constant voltage across the distance between the neck region 112 and a portion of the bias layer 102. In certain embodiments, the AC voltage provided to the bias layer 102 may have a phase shift with respect to the AC voltage provided to the gate 110, for example to compensate for a delay in the voltage response of the bias layer 102 or the gate 110 due to geometry or external circuit elements. The drive circuit for the gate 110 and bias layer 102 are discussed in greater detail with respect to FIG. 10B.

It is well known that electrostatic fields are higher at sharp corners compared to rounded corners. Charges can become so concentrated at a pointed feature, e.g., the sharp tip on a lightning rod, that the electric field becomes great enough to remove the charges from the surface. To reduce the charge concentration and possible leakage, a conductor should be very smooth with a large radius of curvature. With regard to the gate geometry in semiconductor devices, a sharp corner on the side towards the drain may allow increased electromigration and can lead to premature breakdown at lower voltages and temperatures then anticipated by theory. The electrostatic field strength is inversely proportional to the radius, and therefore the field strength at a corner of the gate may be reduced by as much as a factor of 3 by rounding the corner, thereby improving the breakdown stability of the device. Modern nanoimprint techniques may achieve feature sizes as small as 20 nm.

With reference to FIG. 2, charge leakage from the gate 110 may be reduced by placing the gate 110 closer to the source 30 than to the drain 50. In certain embodiments, asymmetric placement of the gate 110 such that the source-to-drain separation is approximately twice the source-to-gate separation provides an reduction in charge leakage from the gate 110. In addition, removing the sharp corner of the gate 110 on the side towards the drain 50, e.g., providing a beveled edge 114, may reduce the electric field and therefore the charge leakage from the edge 114. An even more desirable curved corner shape may be achieved by taking advantage of the characteristics of isotropic wet-etching, as described in greater detail with respect to FIG. 13.

It is advantageous in certain applications to operate an HEMT 100 at elevated temperatures, for example up to 350° C., with low-resistance coupling of the source 30 and drain 50 to the semiconductor layers to minimize power loss and the resultant local heating. In certain embodiments, the source 30 and drain 50 are formed of a nickel palladium gold (Ni/Pd/Au) that may be stable up to 250° C. or higher with $10^{-3}$ to $10^{-4}$ ohm*cm² resistance.

Figure 3A:
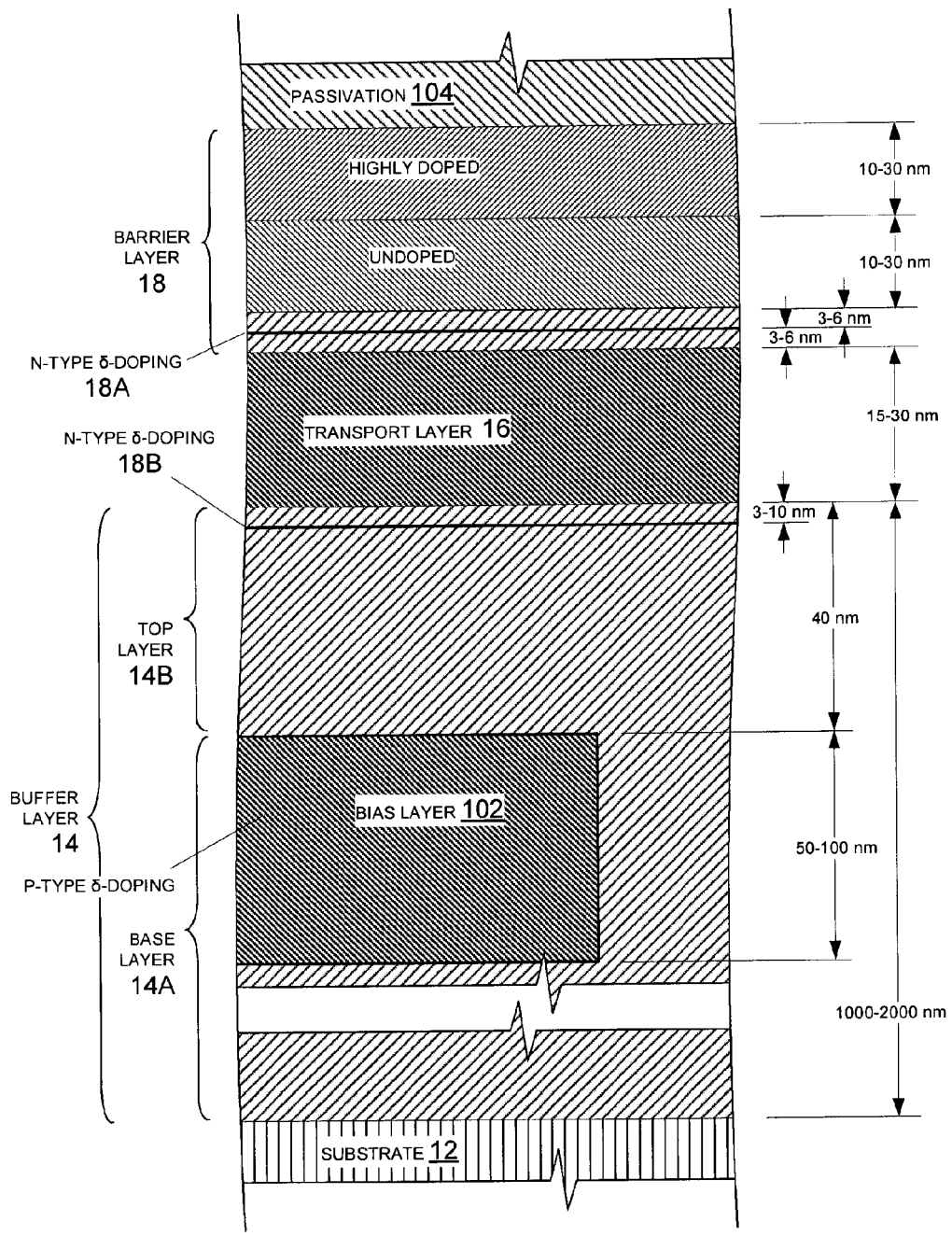
FIG. 3A is an enlargement of a portion of the cross-section of the HEMT in FIG. 2 according to certain aspects of the present disclosure.

FIG. 3A is an enlargement of a portion of the cross-section of the HEMT 100 in FIG. 2 according to certain aspects of the present disclosure. The buffer layer 14 may have a total thickness in the range of 1000-2000 nm and, in certain embodiments, may be approximately 1400 nm. The buffer layer 14 is shown in FIG. 3A with a discontinuity to allow this entire thickness to be shown while retaining visible layers of much lower thicknesses. A doped layer 18A is visible within the barrier layer 18 at a distance of approximately 4 nm, in this embodiment, from the interface between the transport layer 16 and the barrier layer 18. A doped layer 18B is located at a distance in the range of 3-10 nm below the interface between the transport layer 16 and the buffer layer 14 and, in certain embodiments, may be approximately 4 nm. The transport layer 16 has a thickness in the range of 15-30 nm, in certain embodiments, may be approximately 23 nm in thickness. A narrow transport layer 16 may confine the 2DEG better and may provide a better pinch-off characteristic for the current flow from the source 20 to the drain 50 but may also limit the current flow due to the reduced volume of the transport layer 16, e.g. lower transconductance. The barrier layer 18 may have a total thickness in the range of 26-66 nm. The barrier layer includes a layer 18A of N-type δ-doping centered between two spacer layers that are each 3-6 nm in thickness and, in certain embodiments, may be 3 nm each. The doping density of the layer 18a may be approximately $10^{20}$ atoms per cubic centimeter (/cc).

Figure 3B:
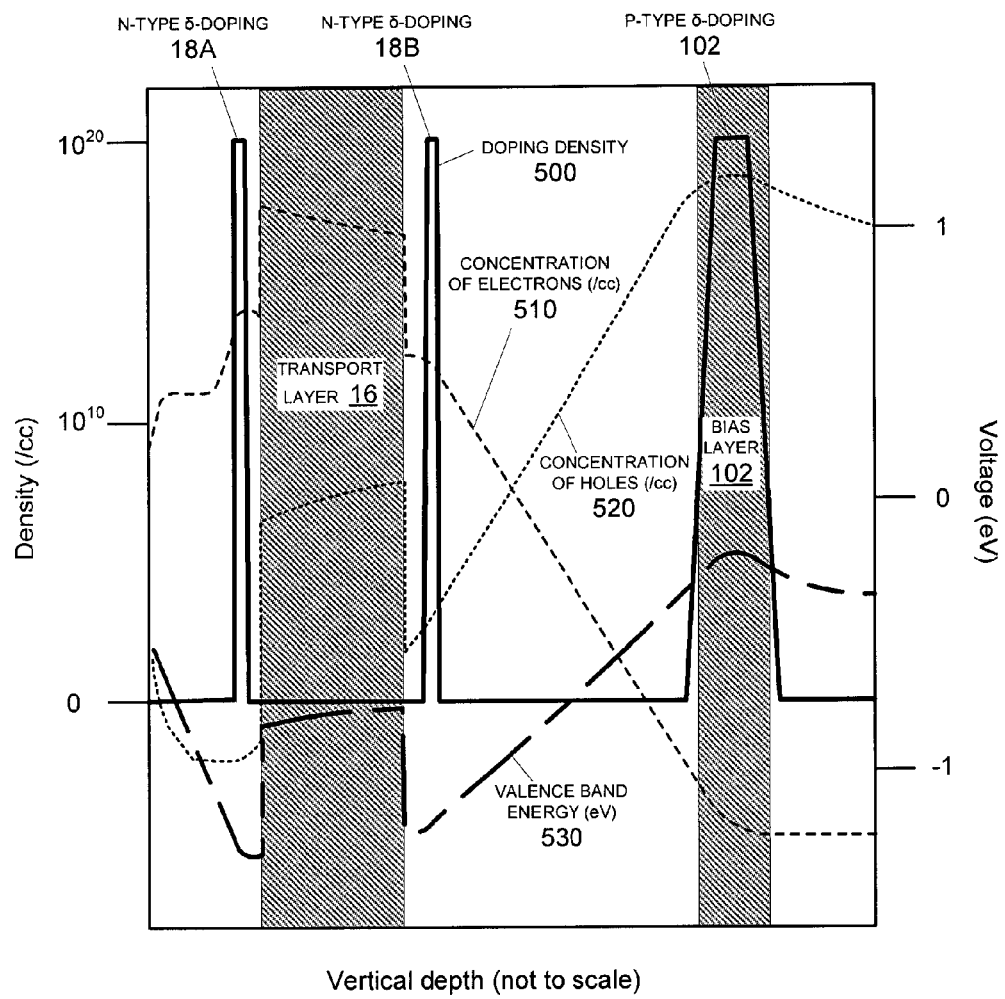
FIG. 3B is a plot of the doping density, concentrations of electrons and holes, and valence band energy through a depth of an example HEMT according to certain aspects of the present disclosure.

FIG. 3B is a plot of the doping density, concentrations of electrons and holes, and valence band energy through a depth of an example HEMT according to certain aspects of the present disclosure. The horizontal axis is not shown to scale so as to provide the information on a single plot. The location and thickness of the transport layer 16 and the bias layer 102 are shown as shaded regions. The doping densities are shown with a single density line 500 even though the layers 18A and 18B, located above and below the transport layer 16, are N-type δ-doping while the bias layer 102 is P-type δ-doping.

In this example, all of the doped regions 18A, 18B, and 102 are doped to a density of approximately $10^{20}$ atoms/cc.

The choice of materials for the barrier layer 18, the transport layer 16, and the buffer layer 14, as well as the selection of dopants, produces the concentration of electrons 510 and concentration of holes 520 shown in FIG. 3B. It can be seen that the concentrations of both the electrons and holes are elevated by several orders of magnitude within the transport layer 16, thereby increasing the conductivity. The bandgap created at the interfaces of the transport layer 16 with the barrier layer 18 and buffer layer 14 can also be seen in the plot of the valence energy 530.

The bias layer 102 has a thickness in the range of 50-100 nm. The depth of the bias layer 102 below the transport layer 16 affects the linearity of the drain current vs. the gate voltage, as is discussed in greater detail with respect to FIG. 11, and is generally 40±3 nm to optimize the linearity. In certain embodiments, the bias layer 102 is formed by forming a base layer 14A of buffer material to a first thickness on the substrate 12, then P-type δ-doping a portion of the surface of the base layer 14A that is intended to form the bias layer 102, then forming a top layer 14B of the same buffer material over the partially doped surface of the base layer 14A. In certain embodiments, the buffer material comprises InAlAs. In certain embodiments, the buffer layer 14 has a thickness in the range of 1000-2000 nm and, in certain embodiments, may have a thickness of 1600 nm.

The thickness of the bias layer 102 and the material and the density of the doping may be selected to achieve a desired conductivity and impedance. In certain embodiments, the P-type δ-doping is accomplished by implanting one of the group of zinc, beryllium, magnesium, cadmium, carbon, silicon, and germanium. In certain embodiments, the doping may be accomplished through diffusion, for example by metal organic chemical vapor deposition (MOCVD) of a volatile organic material or use of a spin-on film with either slow or rapid thermal annealing. In certain embodiments, the doping may be accomplished through ion implantation, for example using energies of 1-1000 kilo-electron-volts (keV) producing penetration depths of 10-10,000 nm. In certain embodiments, the P-type δ-doping is accomplished by implanting one of a group that includes, but is not limited to, zinc, for example in a form such as ZnO or alloys of Ga/Zn or Ga/As/Zn, beryllium, magnesium, cadmium, for example in a form such as compounds similar to those of Zn, carbon, silicon, for example in a form such as $SiH_4$, and germanium, for example in a form such as $GeH_4$. For zinc, a spin-on film containing 10% Zn may prevent damage by protecting the surface of the GaAs against outgassing of the As by diffusing at 700° C. in air for 30 minutes. For silicon, liquid phase epitaxy at 800° C. with at least 5% Si in the melt may be necessary to achieve a concentration of $10^{20}$/cc. Constructing the bias layer 102 can be performed by pausing the growth of InAlAs for the buffer layer 14 and introducing the dopant sufficient to deposit, in certain embodiments, an areal density of approximately $10^{12}$ atoms per square centimeter and $10^{20}$/cc, with appropriate masking steps to apply it only to the area under the source 30 and gate 110, and then resuming the epitaxial growth of the InAlAs. As the areal density of the InAlAs crystal surface is of the order of $10^{20}$ atoms per square centimeter, the δ-doping step deposits approximately 1 atom of dopant per about $10^8$ atoms on the surface. In other embodiments, the areal density of the crystal surface may vary depending on the application and is not be limited to the examples described herein. Other methods of doping semiconductor materials will be known to those of skill in the art.

The P-type δ-doping of the bias layer 102 forms a P-type, Insulator, N-type (PIN) junction with the source region that is N+ doped for low contact resistance. It is this PIN junction that causes the negative potential of the bias layer 102 relative to the source 30. For example, the potential of the bias layer 102 may be approximately −0.7 V that is internally generated by the juxtaposition of the P and N dopings in the buffer material while the gate 110 has an externally applied voltage of −0.4 V.

Figure 4:
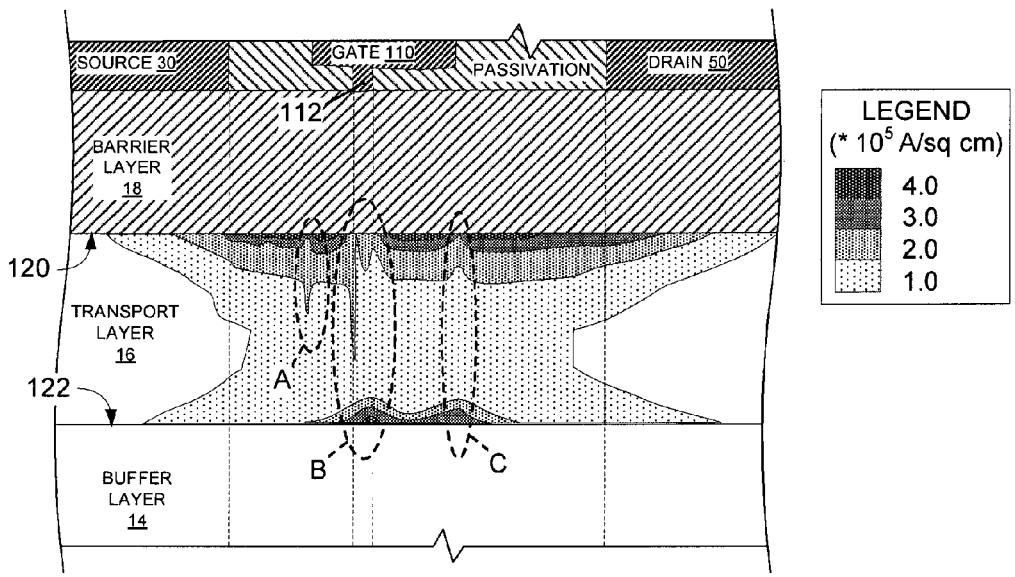
FIG. 4 is a current density map overlaid on a cross-section of an embodiment of an HEMT without a bias electrode according to certain aspects of the present disclosure.

FIG. 4 is a current density map overlaid on a cross-section of an embodiment of an HEMT 100 without a bias electrode according to certain aspects of the present disclosure. The current density is shown as relative magnitudes on an arbitrary scale, as indicated in the legend in FIG. 4, where the darkness of the shading is associated with a higher current density. This plot is a result of a simulation of the structure shown in FIG. 4, wherein the source 30 and drain 50 are formed directly on the barrier layer 18, i.e. without the cap layers 20 shown in FIG. 2, to simplify the model. The vertical dashed lines are provided for reference to indicate relative horizontal positions of the current flow under the source 30, gate 110, and drain 50 surface structures.

The extent of the lightest shading indicates that there is some conduction of current through the bulk of the transport layer 16. The current tends to flow, however, along the upper interface 120 between the transport layer 16 and the barrier layer 18, as indicated by the regions of increasing darker shading along the upper interface 120.

In this example, a certain DC voltage, i.e. without a superimposed AC voltage, is applied to the gate 110. It can be seen in FIG. 4 that the applied voltage is not sufficient to shut off the current flow, as the current continues to flow away from the source 30 toward the drain 50. In the area indicated by the dashed oval labeled "A," the current reaches a point under the left edge of the gate body where the electric field of the voltage on gate 110 spreads out the current, indicated by the narrowing of the darkest shaded area and the widening of the lighter shaded area.

When the current reaches the area indicated by the dashed oval labeled "B," i.e. under the neck 112, the electric field from the neck 112 is strong enough to almost stop the current flowing along the top interface. The physics of an HEMT, however, are such that the current can jump from the quantum well along the top interface to the quantum well along the bottom interface of the transport layer 16, where the electric field from the neck 112 is lower, and continue to flow toward the drain 50. Once the current passes the right edge of the neck 112, the current then jumps back to the quantum well along the top interface and continues to flow toward the drain 50. This is indicated by the presence of the darker shaded regions along the bottom edge of the transport layer 16 in the region under the gate 110 and the reappearance of the darkest shaded regions on the upper interface once to the right of the neck 112.

The gate 110 in the example of FIG. 4 does not have the beveled lower-right edge 114 shown in FIG. 2. In the area indicated by the dashed oval labeled "C," the current passes the right edge of the gate 110 and it can be seen that there is an effect on the current by the field at this corner. The electric field produced by the sharp corner of the body of the gate 110, even though the body is separated from the barrier layer 18, is sufficient that current again jumps across the transport layer 16 and then back to the top interface, as indicated by the second peak in the darker regions along the lower interface and the reduced thickness of the darker regions at this same point on the upper interface. Beveling the lower-right edge 114 reduces this effect but does not mitigate the failure of the voltage applied to gate 110 to stop the current flow at the neck 112.

Figure 5:
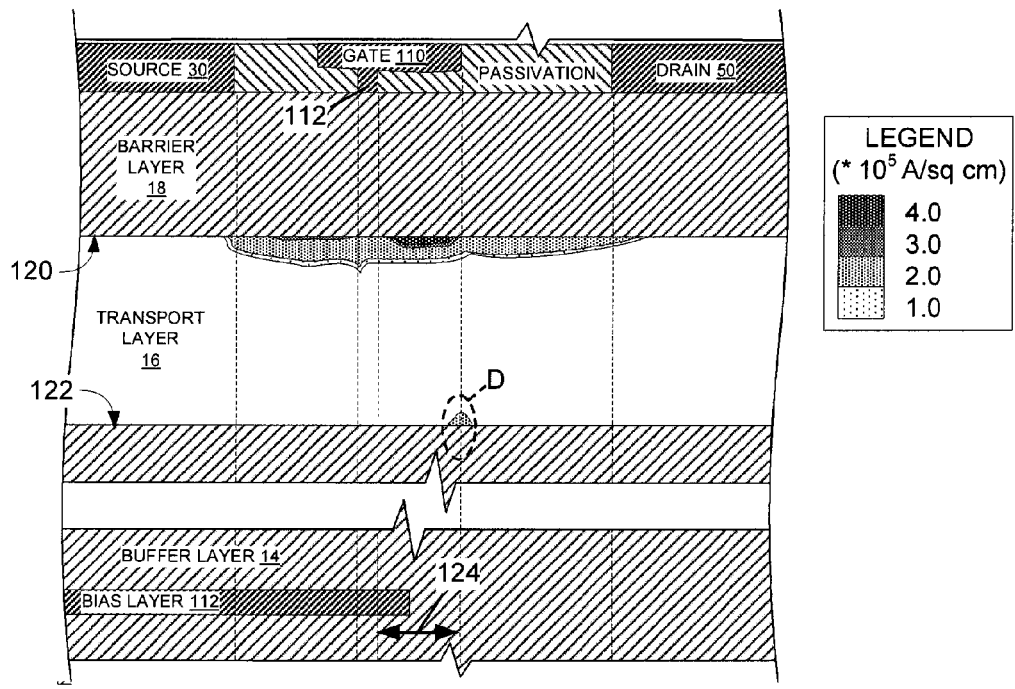
FIG. 5 is a current density map overlaid on a cross-section of an embodiment of an HEMT with a bias layer according to certain aspects of the present disclosure.

FIG. 5 is a current density map overlaid on a cross-section of an embodiment of an HEMT 100 with a bias layer 102 according to certain aspects of the present disclosure. This plot is a result of a simulation with the same DC voltage applied to the gate 110 as applied for the results shown in FIG. 4 for a HEMT without a bias layer 102. In this simulation, the bias layer 112 is connected to the source 30 by means of the source contact doping extending down to and contacting the bias layer 112. As a consequence the bias layer 112 has a negative potential relative to the source 30. This negative potential causes the 2DEG current to be confined to the top of the transport layer 16. It can be seen in FIG. 5 that the current flow along the upper interface 120 has been significantly reduced, with the darkest shaded region not present in FIG. 5, and the absence of even the lightest shading through the bulk of the transport layer 16. It can seen that there is no significant amount of current jumping to the lower interface 122 in the region under the neck 112. There is a small amount of current, indicated within the dashed oval "D," that jumps to the lower interface 122 at the point under the right edge of gate 110, which again does not include the beveled edge 114 in this simulation.

The simulation for the plot of FIG. 5 was conducted with the right edge of the bias layer positioned approximately as shown in FIG. 5. In other embodiments, the right edge of the bias layer may be at any point within the region indicated by the arrow 124. In certain embodiments, the bias layer 112 may extend to the right of the region indicated by the arrow 124, at the possible cost of an increase in leakage current from the bias layer 112 to the drain 50.

FIGS. 6-9 are top views of various embodiments of HEMTs with a bias layer 102 according to certain aspects of the present disclosure. FIG. 6 depicts an HEMT 130 with a single source 30 and a single drain 50 and a transport layer 16 extending under both. The contact pad 110A of the gate 110 is to one side of a line between the source 30 and drain 50. The body portion 114 of the gate 110 is omitted for clarity in order to show the position of the neck portion 112. The neck portion 112 extends across the entire width of the transport layer 16. A bias layer 102 is also partially visible as parallel to the neck portion 112 and underneath the transport layer 16. The bias layer 102 is electrically connected to the source 30. The top of the bias layer 102 is, in this view, located behind the neck portion 112.

FIG. 7 depicts another embodiment of an HEMT 135 having two source contact pads 30A and 30B, for example as connection points for redundant sources of current, and two contact pads 110A and 110B for the gate 110, with the body portion of gate 110 again omitted for clarity. The two gate contact pads 110A, 110B are located on opposite ends of the neck portion 112, for example to allow control of the HEMT 210 by redundant circuits (not shown in FIG. 7). The two source contact pads 30A and 30B are electrically connected to the bias layer 102.

FIG. 8 depicts another embodiment of an HEMT 140 having two source contact pads 30A and 30B and a single contact pad 110A disposed between the source contact pads 30A, 30B. The body portion of gate 110 is again omitted for clarity. The bias layer 102 can be seen under the wider portion of the gate 110 that extends upward, in the view of FIG. 8, from the contact pad 110A and then extends laterally in both directions under the neck portion 112. The two source contact pads 30A and 30B are electrically connected to the bias layer 102.

FIG. 9 depicts another embodiment of an HEMT 145 having five source contact pads 30A, 30B, 30C, 30D, and 30E and four contact pads 110A, 110B, 110C, and 110D. Such a configuration may be used with multiply-redundant system designs for to provide redundant connection points for a current source or gate-voltage controller (not shown in FIG. 9). The four source contact pads 30A-30D are electrically connected to the bias layer 102.

Figure 10A:
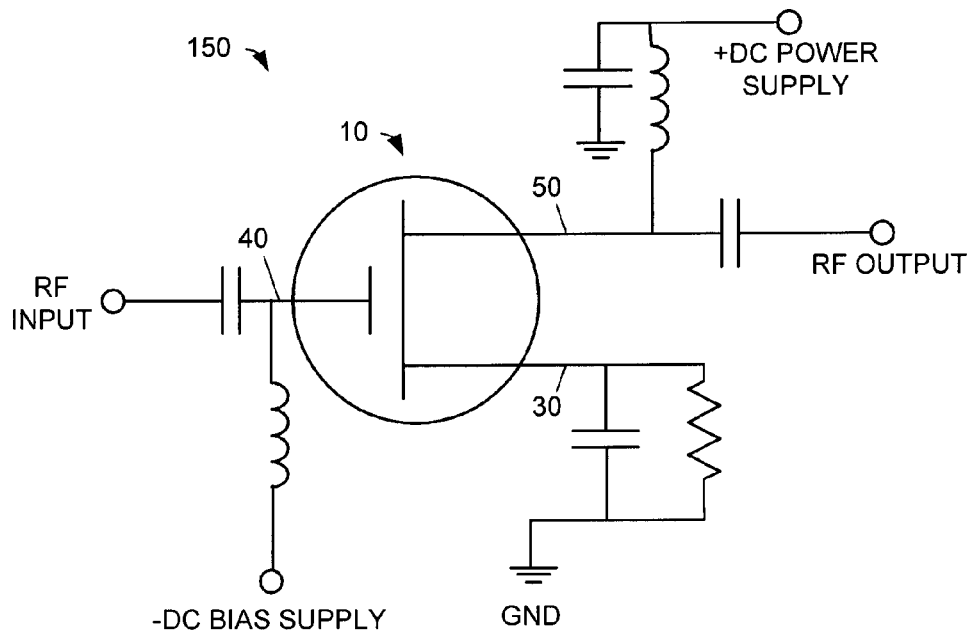
FIG. 10A is an example drive circuit for a conventional HEMT.

FIG. 10A is an example drive circuit 150 for a conventional HEMT 10. The radio-frequency (RF) input is AC-coupled to the gate 40 along with a negative DC biasing voltage source. The drain 50 is supplied by a positive DC power source and AC-coupled to the RF output. The extra weight and complexity of the negative bias supply for the input are undesirable for certain applications, for example a portable system or a spacecraft communication system. Although the signal input to the gate 40 is shown as capacitively coupled, it could equally well be coupled in by a transformer in place of the indicated inductor.

Figure 10B:
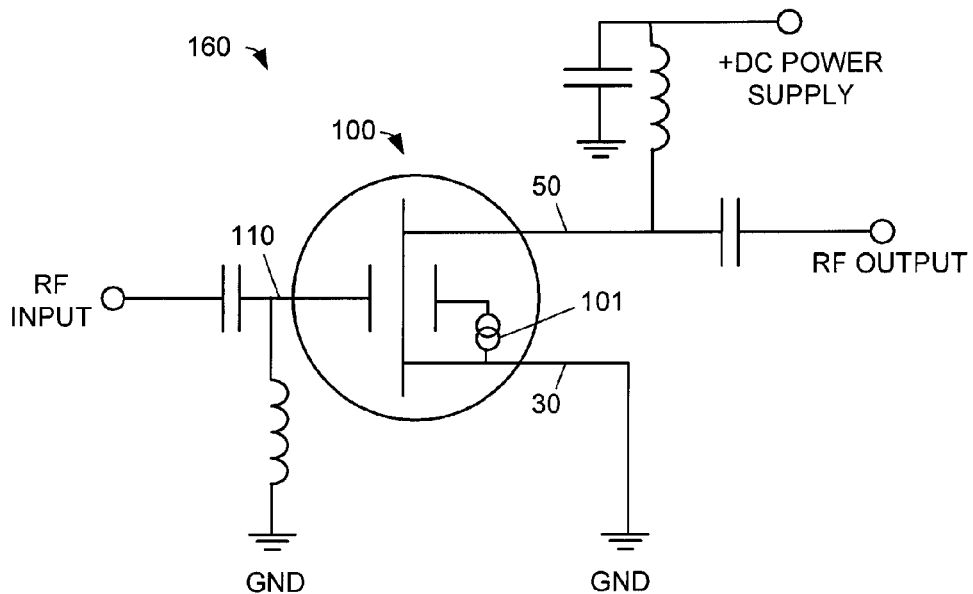
FIG. 10B is an example drive circuit for a high-performance HEMT according to certain aspects of the present disclosure.

FIG. 10B is an example drive circuit 160 for a high-performance HEMT 100 according to certain aspects of the present disclosure. Although the signal input to the gate 110 is shown capacitively coupled, it could equally well be coupled in by a transformer in place of the indicated inductor, in which case the capacitor would be eliminated. The RF input is AC-coupled to the gate 110 without a DC biasing voltage source and is DC-referenced to ground. The drain 50 is supplied by a DC power source and AC-coupled to the RF output. The elimination of the negative DC bias supply, compared to the conventional system 150 of FIG. 10A, may provide a reduction of weight and complexity of the drive system 160 that is particularly advantageous in certain applications, e.g. spacecraft, where weight and reliability are critical concerns.

Figure 10C:
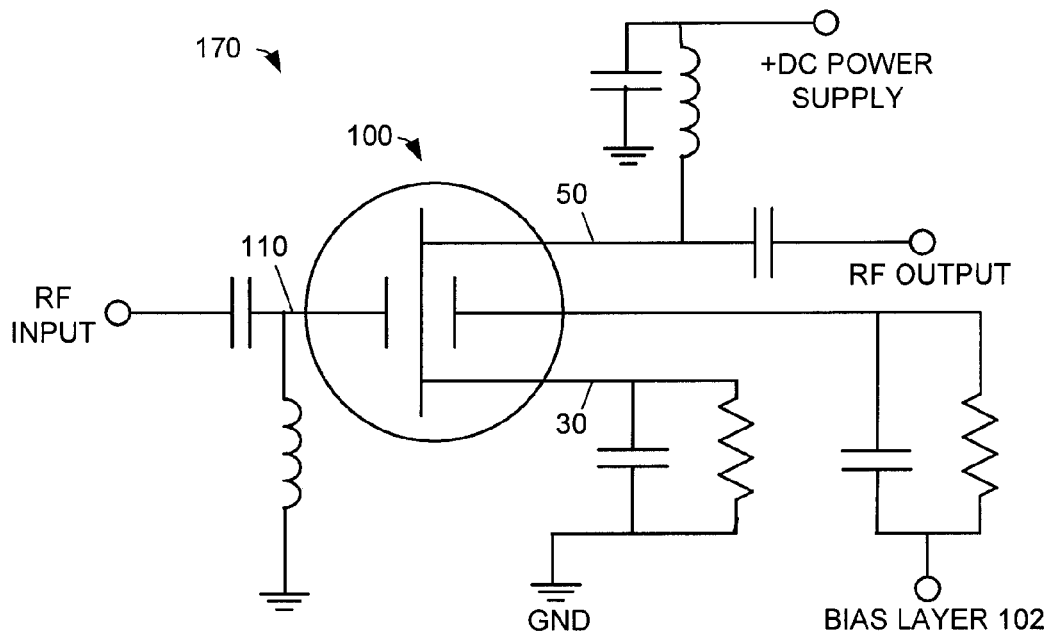
FIG. 10C is another example drive circuit for a high-performance HEMT according to certain aspects of the present disclosure.

FIG. 10C is another example drive circuit 170 for a high-performance HEMT 100 according to certain aspects of the present disclosure. The RF input is AC-coupled to the gate 110 without a negative DC biasing voltage source and is DC-referenced to ground. The drain 50 is supplied by a DC power source and AC-coupled to the RF output. In this embodiment, the bias layer is isolated from the source 30 and is configured to be driven from an external source (not shown in FIG. 10C).

Figure 11:
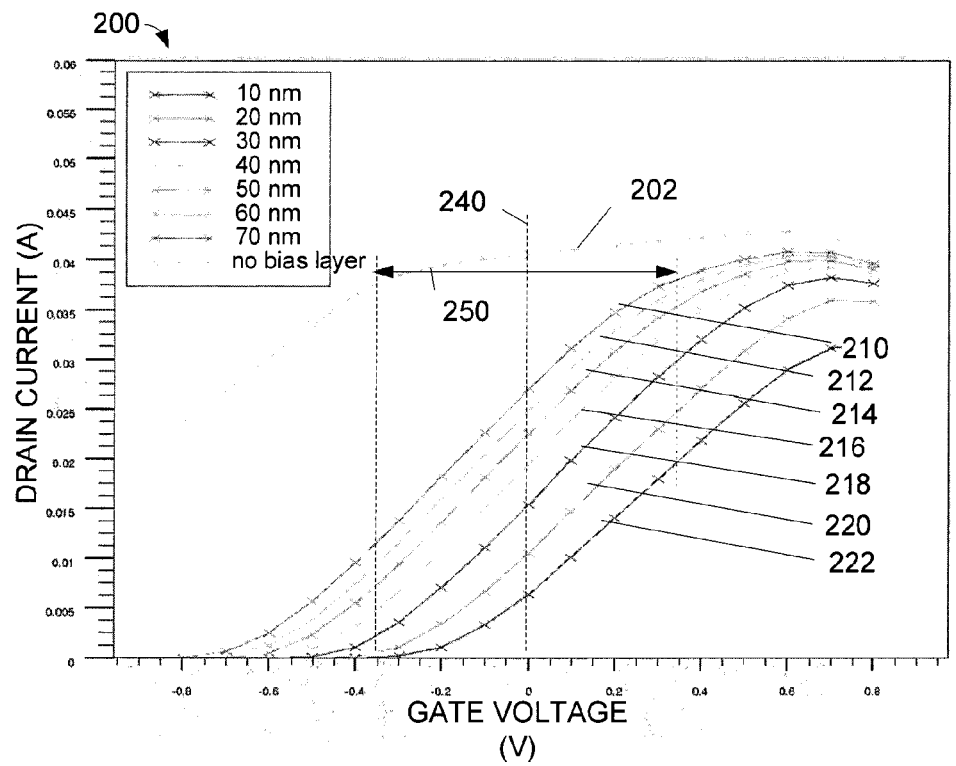
FIG. 11 is a plot of drain current vs. gate voltage for various depths of the bias layer according to certain aspects of the present disclosure.

FIG. 11 is a plot 200 of drain current vs. gate voltage for various depths of the bias layer 102 according to certain aspects of the present disclosure. Curve 202 represents the current for a HEMT as configured in FIG. 1 without a bias layer 102. The vertical dashed line 240 indicates a zero voltage on either the gate 40 of the HEMT 10 of FIG. 1, for curve 202, or the gate 110 of the HEMT 100 of FIG. 2, applicable to curves 210-222. Note that curve 216 is the response of a HEMT with optimal bias layer depth such that the linear range 250 about zero gate voltage 240 is maximized.

The curves 210, 212, 214, 216, 218, 220, and 222 show the drain current over a range of gate voltages for a bias layer 102 at a respective depth of 70, 60, 50, 40, 30, 20, and 10 nm below the interface between the transport layer 16 and the buffer layer 14. The depth of the bias layer 102 has an effect on the transconductance of the HEMT 100. The curve 22, for a depth of 10 nm, shows that the drain current remains at zero amps (A) until the gate voltage is above −0.4 volts (V) then rises exponentially until the gate voltage reaches approximately 0 V where it transitions to a linear region up to approximately 0.6 V and then rolls off. As the linear region covering the voltage range 0-0.6 V and is, therefore, not centered, this embodiment may not be satisfactory is certain applications. It can be seen that as the depth of the bias layer 102 increases, the curves transition toward the no-bias-layer curve 202.

Curve 216, corresponding to a bias layer 102 that is approximately 40 nm below the transport layer 16, exhibits the most linear behavior within the range 250 that is centered about the zero-voltage line 240.

Figure 12:
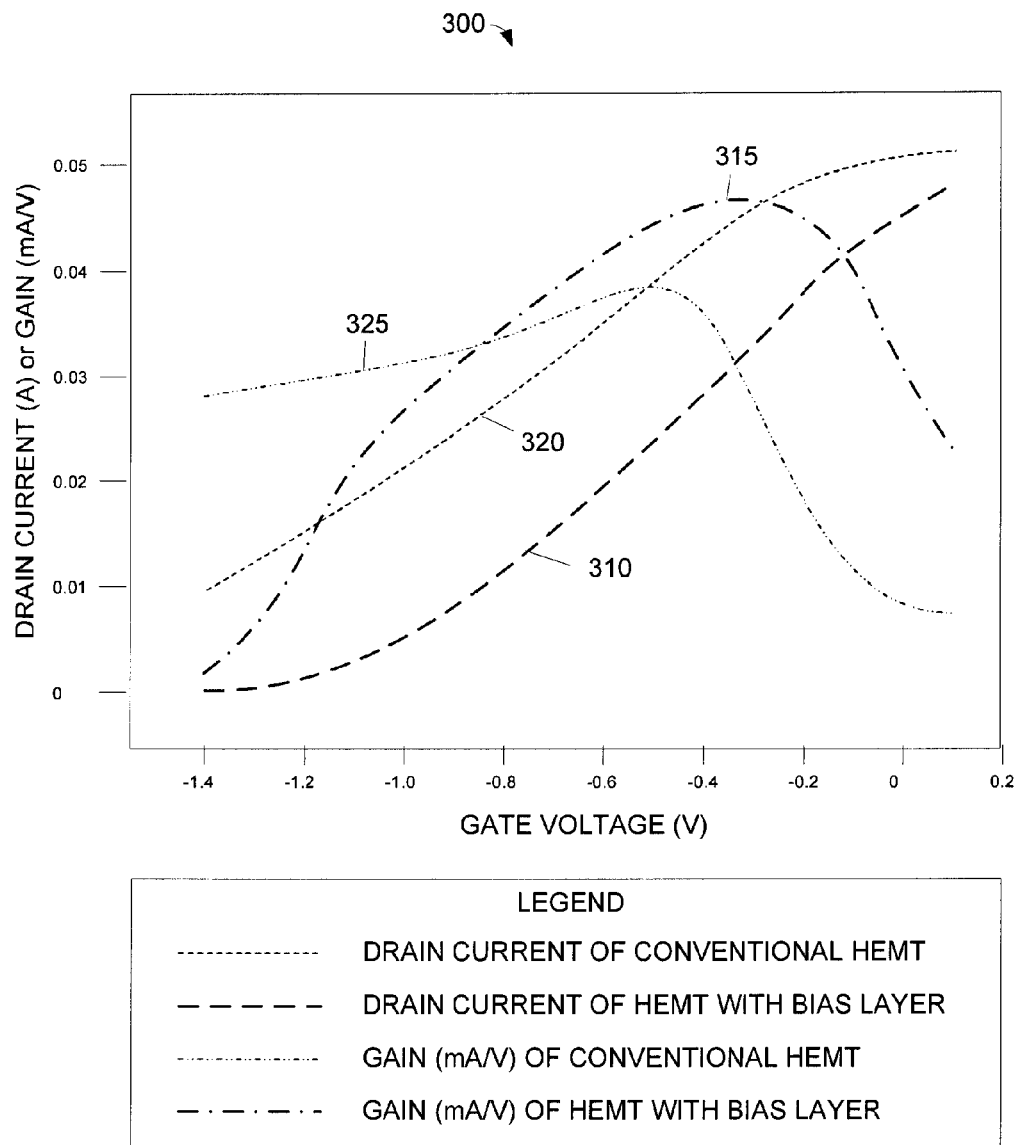
FIG. 12 is a plot illustrating an increase in gain of an example HEMT over a conventional HEMT not having a bias layer according to certain aspects of the present disclosure.

FIG. 12 is a plot 300 illustrating an increase in gain of an example HEMT 100 over a conventional HEMT 10 not having a bias layer according to certain aspects of the present disclosure. The x-axis is the gate voltage and the Y-axis is either drain current, for curves 310 and 320, or the gain of the device, for curves 315 and 325. The curves 315 and 325 are the respective slopes of curves 310 and 320 and it can be seen in FIG. 12 that curve 310 is steeper than curve 320, which is reflected in the curve 315 rising to a higher value than curve 325. The peak gain of the HEMT 100 is the maximum value of curve 315 of approximately 47 mA/V, compared to the peak gain of the HEMT 10, which is the maximum value of curve 325 of approximately 39 mA/V. Thus, the inclusion of a bias layer 102 provides an increase of approximately 20% in the gain of a HEMT 100 compared to a conventional HEMT 10.

Figure 13A:
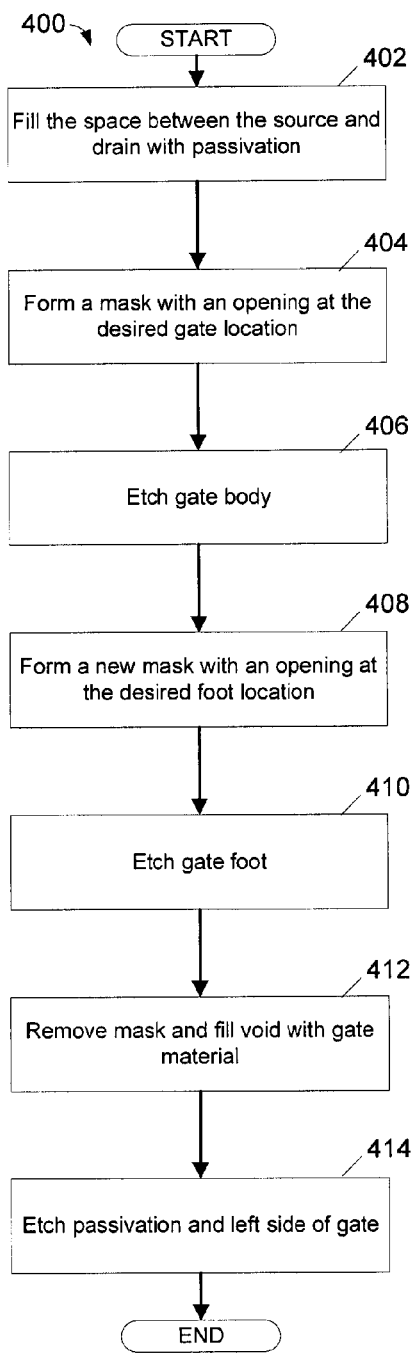
FIG. 13A is a flowchart of a method of forming a gate with a rounded corner according to certain aspects of the present disclosure.
Figure 13A:
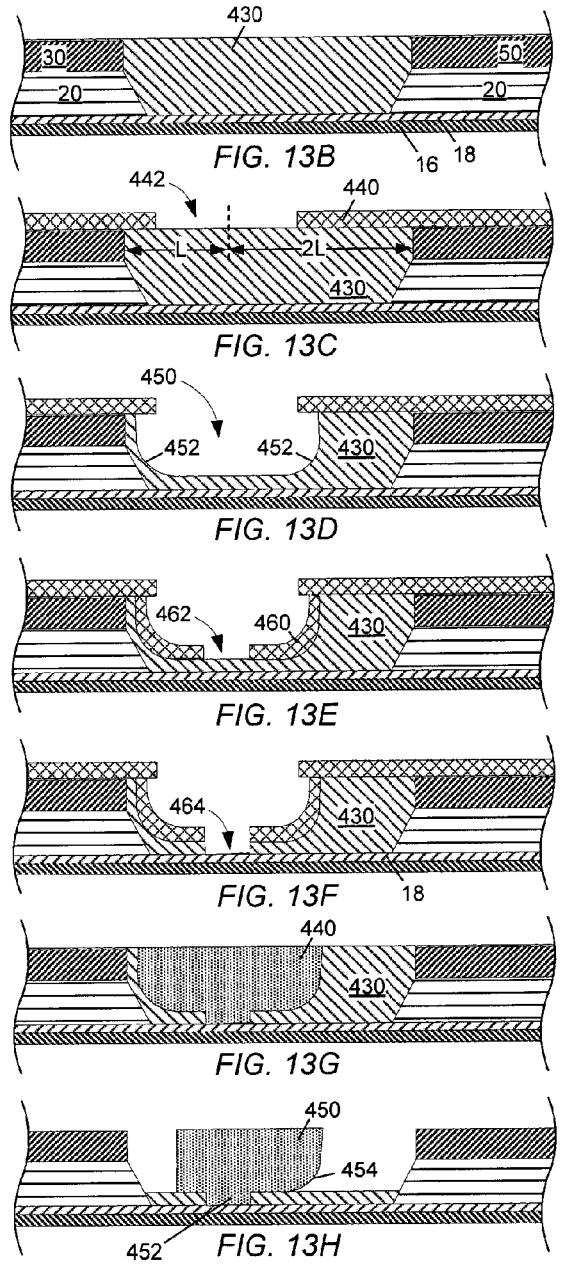

FIG. 13A is a flowchart 400 of a method of creating, with reference to FIG. 13H, a gate 450 with a rounded corner 454 according to certain aspects of the present disclosure. Each of the steps 402, 404, 406, 408, 410, 412, and 414 of the flowchart 400 has a matching illustration in FIGS. 13B-13H. In step 402, the space between the source 30 and the drain 50 is filled with a passivation material 430, for example an amorphous SiN. In step 404, a layer of photoresist 440 is applied and masked such that a hole 442 is formed that is, in certain embodiments, located such that the distance L from the source 30 to the center of the hole 442 is approximately half of the distance 2L from the center of the hole 442 to the drain 50. A uniform wet etch is performed, for example using hot phosphoric acid for SiN, creating a cavity 450 with smooth, rounded corners 452 on both sides. In step 408, another layer of photoresist 460 is formed with an opening 462, for example aligned in the middle of the hole 442. An anisotropic etch is performed to create the hole 464, where the barrier layer 16 serves as an etch stop. In step 412, the photoresist 440 and 460 are removed and the entire void filled with a conductive material 440. In step 414, the left portion of the material 440 may be optionally etched away, resulting in a gate 450 having the desired features of a small foot 452 and a rounded corner 454 on the drain-facing side of the gate 450 so as to reduce current leakage, as previously discussed. Additional passivation may be formed over the finished gate 450 so as to provide protection, for example as the passivation layer 104 of FIG. 2.

In summary, the present disclosure describes an HEMT that, in certain embodiments, includes a gate electrode formed over a transport layer between a source and a drain with a bias layer that includes a P-type dopant beneath the transport layer. In various embodiments, the bias layer is configured to create a negative bias field so as to limit current on the bottom side of the transport layer. In certain embodiments, the gate structure is modified to reduce the width of the contact area between the gate and the barrier layer. In certain embodiments, the HEMT is driven solely by an AC signal and does not require either a positive or a negative DC bias voltage.

It should be understood that the thickness or depth of each material or layer formed over the substrate can vary in size depending on the application and should not be limited to the configurations described herein. It is contemplated that other intermediary layers can be disposed between each layer of the structure in accordance with other embodiments.

Although this disclosure has presented one or more embodiments of systems and methods, those skilled in the art will readily appreciate that these are only illustrative examples. It should be understood that various modifications, alterations, substitutions, or equivalent arrangements not described herein can be made without departing from the spirit of this disclosure. Additionally, it is to be understood that the systems and methods may be practiced without necessarily including every aspect disclosed herein. Accordingly, the scope of the claims are not to be seen as limited by the foregoing description.

What is claimed is:

1. A high electron mobility transistor (HEMT) comprising:
a transport layer comprising a first material having a first bandgap;
a barrier layer comprising a second material disposed directly on the transport layer, the second material having a second bandgap that is different from the first bandgap, wherein a bandgap difference between the first and second bandgaps results in a quantum well in a conduction band along an interface between the first and second materials; and
a bias layer disposed under a portion of the transport layer and configured to be coupled to a first non-biased alternating current (AC) signal that allows operation of the HEMT without applying a direct current (DC) bias to a gate node of the HEMT.

2. The HEMT of claim 1, wherein the barrier layer comprises a sub-layer of N-type δ-doped second material.

3. The HEMT of claim 1, further comprising:
a conductive source disposed over a first area of the interface;
a conductive drain disposed over a second area of the interface, wherein the second area is separated from the first area;
a conductive gate disposed over a third area of the interface, wherein the third area is between the first and second areas, wherein the bias layer has a tip and the third area is further disposed over the tip.

4. The HEMT of claim 3, wherein the HEMT is configured to substantially prevent current from flowing between the conductive source and the conductive drain when the gate is provided with a second non-biased alternating current (AC) signal and the first bias layer is provided with a second non-biased AC signal.

5. The HEMT of claim 4, wherein:
the HEMT is configured to accept a third non-biased AC signal having a frequency on the conductive source;
the first and second non-biased AC signals both comprise the frequency of the third AC signal.

6. The HEMT of claim 4, wherein:
the first non-biased AC signal comprises a first amplitude; and
the second non-biased AC signal comprises a second amplitude.

7. The HEMT of claim 3, wherein the conductive gate comprises a body portion having a first width, and a neck portion coupled to the body portion and disposed between the body portion and the barrier layer, the neck portion having a second width that is less than the first width.

8. The HEMT of claim 7, wherein the body portion of the conductive gate is generally rectangular in cross-section and comprises a bevel along an edge between a surface nearest to the barrier layer and a surface that is nearest to the conductive drain.

9. The HEMT of claim 1, further comprising a buffer layer, wherein:

the transport layer is disposed over a buffer layer comprising the first material;
the bias layer comprises a sub-layer of a P-type δ-doped first material disposed within the buffer layer.

10. The HEMT of claim 9, wherein the bias layer comprises a sub-layer of the buffer layer, wherein the sub-layer has been doped with one of a group comprising zinc, beryllium, magnesium, cadmium, carbon, silicon, and germanium.

11. A high electron mobility transistor (HEMT) comprising:
a substrate;
a buffer layer formed on the substrate;
a transport layer formed directly on the buffer layer;
a barrier layer formed directly on the transport layer; and
a bias layer formed within the buffer layer under a portion of the transport layer, wherein the bias layer comprises a sub-layer of a P-type δ-doped material that is different from the material of the buffer layer and the barrier layer.

12. The HEMT of claim 11, wherein:
the buffer layer and barrier layers each comprise a sub-layer of N-type δ-doped material.

13. The HEMT of claim 12, wherein the bias layer comprises a sub-layer of the buffer layer, wherein the sub-layer has been doped with one of a group comprising zinc, beryllium, magnesium, cadmium, carbon, silicon, and germanium.

14. The HEMT of claim 2 further comprising a source, a gate, and a drain formed over the barrier layer, wherein:
the gate comprises a body portion and a neck portion coupled to the body portion;
the neck portion is in contact with the barrier layer; and
the body portion is separated from the barrier layer.

15. The HEMT of claim 14, wherein an edge of the body portion that is closest to both the barrier layer and the drain comprises a bevel.

16. The HEMT of claim 14, wherein the HEMT is configured to substantially prevent current from flowing between the source and the drain when the gate and the bias layer are respectively provided with first and second alternating current (AC) signals having a common frequency.

17. A transistor, comprising:
a transport layer comprising a first material having a first bandgap;
a barrier layer comprising a second material disposed directly on the transport layer, the second material having a second bandgap that is different from the first bandgap, wherein a bandgap difference between the first and second bandgaps results in a quantum well in a conduction band along an interface between the first and second materials; and
a gate disposed over the barrier layer and comprising a neck portion that is in contact with the barrier layer and a body portion having a bevel on a bottom and downstream edge that is separated from the barrier layer and is covered with a passivation layer.

18. The transistor of claim 17, wherein the bevel on the bottom and downstream edge comprises a rounded profile.

19. The transistor of claim 17, further comprising a drain disposed over the barrier layer and separated from a downstream side of the gate.

20. The transistor of claim 17, further comprising a source disposed over the barrier layer and separated from an upstream side of the gate on the opposite side from the downstream side.

21. A transistor, comprising:
a transport layer comprising a first material having a first bandgap;
a barrier layer comprising a second material disposed directly on the transport layer, the second material having a second bandgap that is different from the first bandgap;
a gate disposed over the barrier layer and comprising a body portion having a first width and a neck portion having a second width that is less than the first width, wherein the neck portion is disposed between the body portion and the barrier layer; and
a bias layer disposed under a portion of the transport layer and configured to be coupled to a non-biased alternating current (AC) signal that allows operation of the HEMT without applying a direct current (DC) bias to a gate node of the HEMT.

22. The transistor of claim 21, further comprising a source disposed over the barrier layer and separated from an upstream side of the gate, wherein a center of the neck portion of the gate is offset from a center of the body portion of the gate toward the source.

23. The transistor of claim 21, wherein a bandgap difference between the first and second bandgaps results in a quantum well in a conduction band along an interface between the first and second materials, and wherein the second width is less than 50% of the first width.

24. The transistor of claim 23, wherein the second width is less than 25% of the first width.

* * * * *